(12) United States Patent
Lee et al.

(10) Patent No.: US 8,705,773 B2
(45) Date of Patent: Apr. 22, 2014

(54) AUDIO AMPLIFIER

(71) Applicant: Samsung Electronics Co., Ltd., Gyeonggi-do (KR)

(72) Inventors: Yong-Hee Lee, Gyeonggi-do (KR); Chun Kyun Seok, Seoul (KR); Wang-Seup Yeum, Gyeonggi-do (KR); Seung-Bin You, Gyeonggi-do (KR); Bong-Joo Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/949,971

(22) Filed: Jul. 24, 2013

(65) Prior Publication Data

US 2013/0301854 A1 Nov. 14, 2013

Related U.S. Application Data

(63) Continuation of application No. 12/845,424, filed on Jul. 28, 2010, now abandoned.

(30) Foreign Application Priority Data

Oct. 1, 2009 (KR) ........................ 10-2009-0094000

(51) Int. Cl.
*H03F 99/00* (2009.01)

(52) U.S. Cl.
USPC ............. 381/120; 381/28; 381/107; 381/123; 381/58; 330/10; 330/251; 330/265

(58) Field of Classification Search
USPC ........ 381/28, 57, 58, 71.9, 74, 75, 81, 80, 83, 381/84, 92, 93, 94.1, 94.2, 94.5, 94.6, 94.8, 381/94.9, 95, 97, 98, 101, 100, 103, 104, 381/106, 107, 108, 110, 119, 120, 121, 122, 381/123; 700/94; 341/118, 120; 330/305, 3, 330/910, 251, 256, 258, 265; 455/114.2, 455/63.1, 296, 126, 115, 324, 130, 131; 375/319; 327/307

See application file for complete search history.

(56) References Cited

U.S. PATENT DOCUMENTS

| 4,356,450 A | * | 10/1982 | Masuda | 330/9 |
| 5,061,900 A | * | 10/1991 | Vinn et al. | 330/9 |
| 5,087,914 A | * | 2/1992 | Sooch et al. | 341/120 |
| 5,381,148 A | * | 1/1995 | Mueck et al. | 341/139 |
| 5,397,944 A | * | 3/1995 | DuPuis | 327/307 |
| 5,557,239 A | * | 9/1996 | Masao | 330/259 |
| 5,697,085 A | * | 12/1997 | Birth et al. | 455/296 |

(Continued)

FOREIGN PATENT DOCUMENTS

| JP | 2000-022458 | 1/2000 |
| JP | 2003-249825 | 9/2003 |
| KR | 1020040030377 | 4/2004 |

*Primary Examiner* — Leshui Zhang
(74) *Attorney, Agent, or Firm* — F. Chau & Associates, LLC

(57) ABSTRACT

An audio amplifier includes a compensation unit, an output unit and a calibration unit. The compensation unit generates a compensation signal based on a digital input signal, a digital reference code, a mode signal and a digital approximation code. The output unit generates an output signal based on the compensated input signal. The calibration unit generates the digital approximation code based on the output signal and the mode signal. The digital approximation code includes a plurality of bits that are generated sequentially.

15 Claims, 10 Drawing Sheets

(56) References Cited

U.S. PATENT DOCUMENTS

| | | | |
|---|---|---|---|
| 5,731,772 A * | 3/1998 | Mikkola et al. | 341/118 |
| 5,789,974 A * | 8/1998 | Ferguson et al. | 330/2 |
| 6,100,827 A * | 8/2000 | Boesch et al. | 341/118 |
| 6,111,965 A * | 8/2000 | Lubbe et al. | 381/94.5 |
| 6,498,531 B1 | 12/2002 | Ulrick et al. | |
| 7,142,047 B2 * | 11/2006 | Sahandiesfanjani et al. | 330/9 |
| 2002/0186075 A1 * | 12/2002 | Llewellyn | 330/9 |
| 2006/0099917 A1 * | 5/2006 | Papathanasiou et al. | 455/114.2 |
| 2006/0223457 A1 * | 10/2006 | Rahman | 455/78 |
| 2008/0089391 A1 * | 4/2008 | O'Shea | 375/136 |
| 2009/0233566 A1 * | 9/2009 | Li et al. | 455/257 |
| 2010/0120384 A1 * | 5/2010 | Pennec | 455/126 |

\* cited by examiner

AUDIO AMPLIFIER

CROSS-REFERENCE TO RELATED APPLICATIONS

This application is a Divisional of U.S. application Ser. No. 12/845,424, filed on Jul. 28, 2010, which claims priority under 35 U.S.C. §119 to Korean Patent Application No. 10-2009-0094000, filed on Oct. 1, 2009 in the Korean Intellectual Property Office (KIPO), the disclosures of which are incorporated by reference herein in their entireties.

BACKGROUND

1. Technical Field

Example embodiments relate to an audio amplifier, and more particularly to an audio amplifier that compensates a DC offset included in an output signal thereof.

2. Description of the Related Art

An audio amplifier is widely used to amplify an input audio signal to provide an amplified output audio signal for driving a load such as a speaker. Generally, the audio amplifier may be categorized into a class-A amplifier, a class-B amplifier, a class-AB amplifier and a class-D amplifier. The class-A, class-B and class-AB amplifiers may be used in an analog system and the class-D amplifier may be used in a digital system.

The class-A amplifier is used for amplifying a small signal, but has relatively low efficiency. The class-B amplifier has higher efficiency than the class-A amplifier, but has low linearity characteristic due to crossover distortion. The class-AB amplifier has higher efficiency than the class-A amplifier and higher linearity characteristic than the class-B amplifier, but has lower efficiency than the class-D amplifier. The class-D amplifier has relatively high efficiency that is typically more than 80% at maximum output. In addition, the class-D amplifier may be implemented in a silicon chip with a small size as well as low cost. Accordingly, the class-D amplifier may be widely used in low power applications, particularly mobile devices, which are required to be miniaturized with low power consumption.

SUMMARY

Accordingly, the inventive concept is provided to substantially obviate one or more problems due to limitations and disadvantages of the related art.

Some example embodiments provide an audio amplifier configured to compensate a direct current (DC) offset of the output signal.

Some example embodiments provide an audio amplifier configured to improve power efficiency.

According to some example embodiments, an audio amplifier includes a compensation unit, an output unit and a calibration unit. The compensation unit generates a compensation signal based on a digital input signal, a digital reference code, a mode signal and a digital approximation code. The output unit generates an output signal based on the compensation signal. The calibration unit generates the digital approximation code based on the output signal and the mode signal. The digital approximation code includes a plurality of bits that are generated sequentially.

In some embodiments, the calibration unit may include a comparator and a successive approximation register. The comparator compares an analog reference signal with the output signal in response to the mode signal to generate a comparison signal. The successive approximation register generates the bits of the digital approximation code sequentially from a most significant bit to a least significant bit based on the comparison signal.

The compensation unit may include a register. The register may store the digital approximation code as a compensation code in response to the mode signal. The mode signal may indicate a calibration mode or a normal mode. The compensation unit may generate the compensation signal based on the digital approximation code and the digital reference code in the calibration mode, and generate the compensation signal based on the compensation code and the digital input signal in the normal mode.

The compensation unit may further include a first multiplexer, a second multiplexer and a subtractor. The first multiplexer may output one of the digital reference code and the digital input signal in response to the mode signal. The second multiplexer may output one of the digital approximation code and the compensation code in response to the mode signal. The subtractor may generate the compensation signal by subtracting an output of the second multiplexer from an output of the first multiplexer. The compensation unit may further include a digital reference code generator generating the digital reference code.

In some embodiments, the analog reference signal corresponds to an analog ground voltage and the digital reference code corresponds to a digital ground level.

The calibration unit may further include an accumulator. The accumulator may accumulate the comparison signal to provide the accumulated comparison signal to the successive approximation register.

The output unit may include a driving unit and a low pass filter. The driving unit may be driven by a driving voltage, and may amplify a modulation signal to generate an amplification signal. The modulation signal may be generated based on the compensation signal. The low pass filter may filter the amplification signal to generate the output signal.

The driving unit may include a driving voltage generator and a driving circuit. The driving voltage generator may generate the driving voltage based on the compensation code. The driving voltage may include a first driving voltage and a second driving voltage. The driving circuit may be driven by the driving voltage, and may amplify the modulation signal to generate the amplification signal. The sum of the first driving voltage and the second driving voltage may correspond to a value calculated by subtracting the compensation code from the digital reference code.

In other embodiments, the analog reference signal may correspond to a level of the driving voltage divided by N and the digital reference code may correspond to a digital level of the driving voltage divided by N, where N is a natural number.

The driving unit may include a driving signal generator and a driving circuit. The driving signal generator may generate compensation driving signals based on the compensation code and the modulation signal. The driving circuit may be driven by the driving voltage, and may amplify the compensation driving signals to generate the amplification signal.

The driving voltage may include a first driving voltage and a second driving voltage. The compensation unit may include a register and a compensation code calculator. The register may store the digital approximation code as a first compensation code when the digital reference code corresponds to a digital level of the first driving voltage divided by N, and may store the digital approximation code as a second compensation code when the digital reference code corresponds to a digital level of the second driving voltage divided by N. The compensation code calculator may generate the compensation code by adding the first compensation code to the second compensation code.

The compensation driving signals may include PMOS compensation driving signals and NMOS compensation driving signals. The driving circuit may include a plurality of PMOS transistors and a plurality of NMOS transistors. The plurality of PMOS transistors may be connected in parallel between the first driving voltage and a first node. Each of the plurality of PMOS transistors may have a gate electrode receiving one of the PMOS compensation driving signals. The plurality of NMOS transistors may be connected in parallel between the second driving voltage and the first node. Each of the plurality of NMOS transistors may have a gate electrode receiving one of the NMOS compensation driving signals. When the digital reference code corresponds to the digital level of the first driving voltage divided by N, the driving signal generator may generate the PMOS compensation driving signals based on the compensation code. When the digital reference code corresponds to the digital level of the second driving voltage divided by N, the driving signal generator may generate the NMOS compensation driving signals based on the compensation code.

The calibration unit may further include an analog reference signal generator. The analog reference signal generator may generate the analog reference signal based on an analog control signal. The driving voltage may include a first driving voltage and a second driving voltage, and the analog reference signal generator may include a plurality of resistors connected in serial between the first driving voltage and the second driving voltage.

The output unit may include one of a class-A amplifier, a class-B amplifier, a class-AB amplifier and a class-D amplifier According to other example embodiments, an audio amplifier include a sampler, a controller, a compensation unit, a driving unit, a low pass filter, a comparator and a successive approximation register. The sampler samples an input signal to generate a digital input signal. The controller generates a control signal. The audio amplifier determines operation mode and compensating an offset of an output signal based on the control signal. The compensation unit generates a digital reference code based on the control signal and generates a compensation signal based on the digital reference code and a digital approximation code in a calibration mode, and generates the compensation signal based on the digital input signal and the digital approximation code in a normal mode. The driving unit is driven by a driving voltage, and amplifies a modulation signal to generate an amplification signal. The modulation signal is generated based on the compensation signal. The low pass filter filters the amplification signal to generate the output signal. The comparator compares an analog reference signal with the output signal in response to the control signal to generate a comparison signal. The successive approximation register generates the digital approximation code based on the comparison signal. The digital approximation code includes a plurality of bits that are generated sequentially.

The compensation unit may generate the compensation signal by subtracting the digital approximation code from the digital reference code in the calibration mode, and may generate the compensation signal by subtracting the digital approximation code from the digital input signal in the normal mode.

Accordingly, in the audio amplifier according to some example embodiments, the calibration unit generates the digital approximation code and the compensation unit stores the digital approximation code as the compensation code corresponding to the offset of the output signal. Thus, the audio amplifier according to some example embodiments may effectively compensate the offset of the output signal and a quiescent current flowing through the audio amplifier may be reduced. In addition, in the audio amplifier according to some example embodiments, reliability and linearity characteristics may be improved and power consumption may be reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
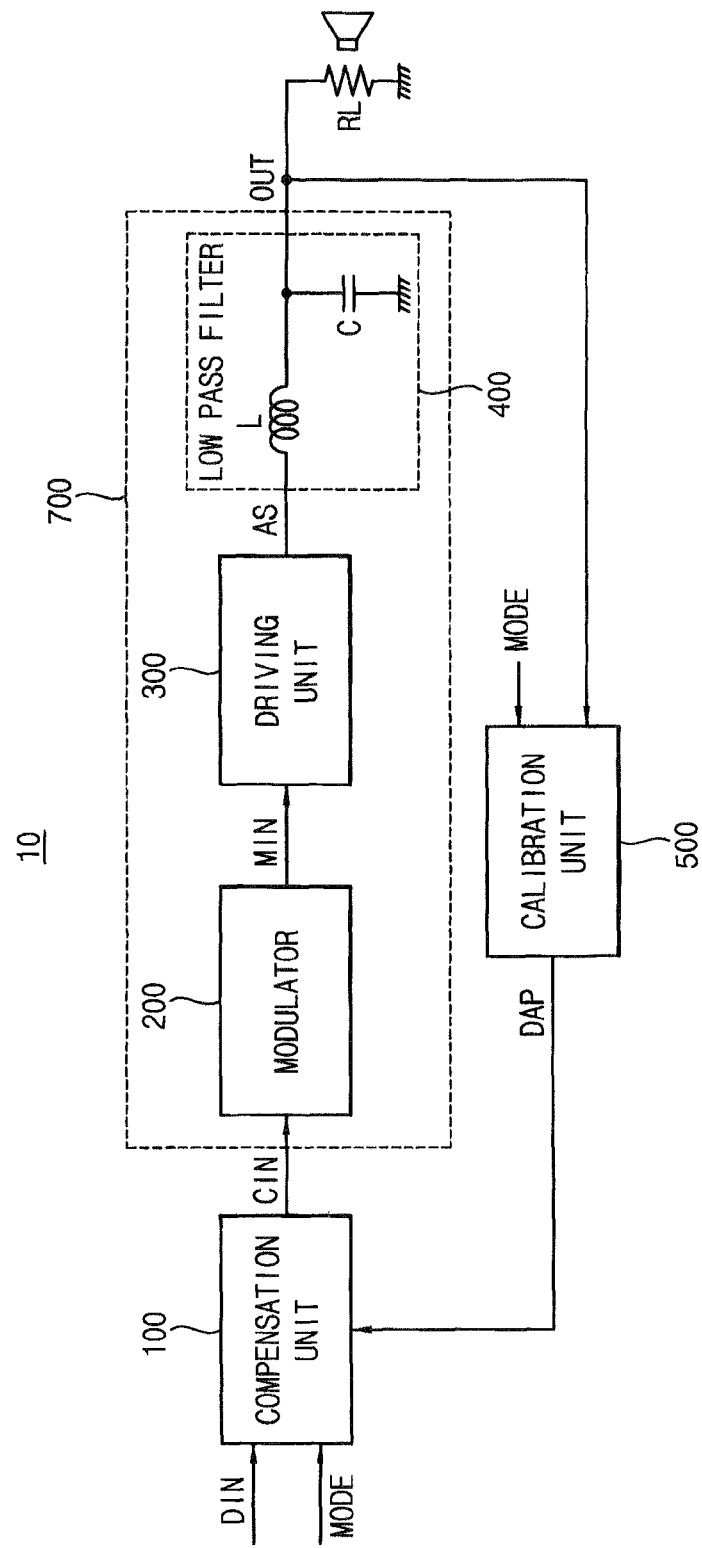
FIG. 1 is a block diagram illustrating an audio amplifier according to some example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an audio amplifier 10 according to some example embodiments.

Referring to FIG. 1, the audio amplifier 10 includes compensation unit 100, an output unit 700 and a calibration unit 500. The audio amplifier 10 may further include an output load RL such as a speaker, microphone, etc.

The audio amplifier 10 may operate alternatively in two modes, that is, a calibration mode or a normal mode. The audio amplifier 10 performs different operations depending on the operation modes. For example, the audio amplifier 10 may calibrate a direct current (DC) offset of an output signal OUT in the calibration mode and may generate the output signal OUT in the normal mode by compensating the DC offset. The operation mode of the audio amplifier 10 is determined based on a mode signal MODE applied from a controller (not shown) or an external device. For example, when the mode signal MODE is enabled (or activated), the audio amplifier 10 may operate in the calibration mode and when the mode signal MODE is disabled (or deactivated), the audio amplifier 10 may operate in the normal mode.

The compensation unit 100 generates a compensation signal CEN based on a digital input signal DIN, a digital reference code DRC, the mode signal MODE and a digital approximation code DAP. The DC offset of the digital input signal. DIN is compensated according to the digital approximation code DAP, and the compensation signal CIN corresponds to a compensated digital input signal. The compensation unit 100 may perform different operations depending on the operation modes. In the calibration mode, the compensation unit 100 generates the compensation signal CIN based on the digital reference code DRC and the digital approximation code DAP. In an example embodiment, the compensation unit 100 may generate the compensation signal CIN by subtracting the digital approximation code DAP from the digital reference code DRC. The digital reference code DRC may be generated by a digital reference code generator included in the compensation unit 100. The digital approximation code DAP includes a plurality of bits that are generated sequentially. For example, the bits of the digital approximation code DAP may be sequentially determined in the calibration mode.

The compensation unit 100 may include a register that stores the digital approximation code DAP as a compensation code CP at a timing point when the mode signal MODE is disabled (i.e., when the audio amplifier 10 starts to operate in the normal mode). The compensation code CP may be a digital code that indicates a compensation level corresponding to the offset of the output signal OUT.

In the normal mode, the compensation unit 100 generates the compensation signal CIN based on the digital input signal DIN and the compensation code CP. The compensation unit 100 may compensate the digital input signal DIN by using the compensation code CP to generate the compensation signal CIN. For example, the compensation unit 100 may generate the compensation signal CIN by subtracting the compensation code CP from the digital input signal DIN. That is, the compensation signal CIN may be generated by adjusting levels of all bits of the digital input signal DIN. In the normal mode, the compensation unit 100 may generate the compensation signal CIN in a reverse manner to the operation for generating the compensation signal CIN in the calibration mode. The compensation code CP may have a fixed value in the normal mode, and the fixed value of the compensation code CP may be substantially the same as the value of the digital approximation code DAP at the timing point when the mode signal MODE is disabled.

The output unit 700 generates an output signal OUT based on the compensation signal CIN. The output unit 700 may include a modulator 200, a driving unit 300 and a low pass filter 400. In an example embodiment, the output unit 700 may include one of a class-A amplifier, a class-B amplifier, a class-AB amplifier and a class-D amplifier.

The modulator 200 modulates the compensation signal CIN to generate a modulation signal MIN. The driving unit 300 is driven by a driving voltage, amplifies the modulation signal MIN to generate an amplification signal AS, and provide the amplification signal AS to the low pass filter 400.

In an example embodiment, the output unit 700 may include a class-D amplifier, particularly having a form of a half-bridge. In the class-D amplifier, the modulator 200 may include a delta-sigma modulator and a pulse width modulator. The driving unit 300 may include complementary metal oxide semiconductor (CMOS) transistors having P-type metal oxide semiconductor (PMOS) transistors and N-type metal oxide semiconductor (NMOS) transistors. Each of PMOS transistors or each of NMOS transistors is turned on in response to the modulation signal MIN (e.g., a pulse width modulation signal) and the driving unit 300 amplifies the modulation signal MIN to a level of the driving voltage based on the switching operation (i.e., turn on or turn off) of the transistors.

For example, the driving voltage of the driving unit 300 may correspond to the power supply voltage VDD. In other examples, the driving voltage may include a first driving voltage and a second driving voltage. The driving circuit included in the driving unit 300 may be connected between the first driving voltage and the second driving voltage. In some example embodiments, the first driving voltage may be the power supply voltage VDD and the second driving voltage may be a ground voltage GND. In other example embodiments, the first driving voltage may be a positive power supply voltage +VDD and the second driving voltage may be a negative power supply voltage −VDD. In each case, a logic level of an output signal of the driving unit 300 (i.e., the amplification signal AS) may have a logic high level or a logic low level between the first driving voltage and the second driving voltage.

The low pass filter 400 filters the amplification signal AS to generate the output signal OUT. The amplification signal AS may be a digital signal and the output signal OUT may be an analog signal. The low pass filter 400 may average a level of the amplification signal AS and may cancel high frequency components of the amplification signal AS. The low pass filter 400 may include an inductor L and a capacitor C.

The calibration unit 500 generates the digital approximation code DAP based on the output signal OUT and the mode signal MODE. For example, the calibration unit 500 may filter the output signal OUT and compare the analog reference signal VAREF with the filtered output signal in response to the mode signal MODE to generate a comparison signal. The analog reference signal VAREF may be generated by an analog reference signal generator included in the calibration unit 500. The calibration unit 500 may generate the digital approximation code DAP based on the comparison signal. The digital approximation code DAP includes a plurality of bits that are generated sequentially. The calibration unit 500 may include a comparator for comparing the analog reference signal VAREF with the filtered output signal and a successive approximation register for generating the digital approximation code DAP. In an example embodiment, the calibration unit 500 may include a sample-and-hold circuit. The calibration unit 500 may operate in synchronization with a clock signal and may generate the digital approximation code DAP in a form of a binary digital code. The digital approximation code DAP may be used in the compensation unit 100 for compensating the DC offset of the output signal OUT.

The digital approximation code DAP may have N bits, where N is a natural number. The calibration unit 500 may generate the bits of the digital approximation code DAP sequentially from a most significant bit (MSB) to a least significant bit (LSB) based on the comparison signal, by using a successive approximation method. The compensation unit 100 may adjust the output signal OUT by predetermined adjustment levels. The predetermined adjustment levels may correspond to bit levels of the digital approximation code DAP determined by the comparison signal. For example, in the calibration mode, the calibration unit 500 may receive the output signal OUT, which is not compensated, may compare the analog reference signal VAREF with the output signal OUT to generate the comparison signal, and may determine the MSB of the digital approximation code DAP based on the comparison signal. The compensation unit 100 may adjust the output signal OUT by a first level corresponding to $2^N$ based on the MSB of the digital approximation code DAP. Next, the calibration unit 500 may receive the adjusted output signal OUT, which is adjusted by the first level, may compare the analog reference signal VAREF with the adjusted output signal OUT to generate the comparison signal, and may generate a bit next to the MSB of the digital approximation code DAP based on the comparison signal. The compensation unit 100 may adjust the output signal OUT by a second level corresponding to $2^{(N-1)}$ based on the bit next to the MSB of the digital approximation code DAP. The adjustment level may be gradually reduced by a half and thus the voltage level of the output signal OUT may be adjusted to be substantially the same as a voltage level of the analog reference signal VAREF. The voltage level of the analog reference signal VAREF may be fixed during the successive approximation process.

The calibration unit 500 may receive the adjusted output signal OUT, compare the analog reference signal VAREF with the output signal OUT and determine one bit of the digital approximation code DAP based on the comparison result. The calibration unit 500 may repeat such receiving, comparing and generating operations for performing the successive approximation process until the voltage level of the output signal OUT is substantially the same as the voltage level of the analog reference signal VAREF. The compensation unit 100 may store the digital approximation code DAP as the compensation code CP at the timing point when the mode signal MODE is disabled and compensate the offset of the output signal OUT based on the compensation code CP.

In an example embodiment, when all bits of the digital approximation code DAP are determined, the mode signal MODE may be disabled and the audio amplifier 10 may operate in the normal mode. In another example embodiment, although some bits of the digital approximation code DAP is not determined, the mode signal MODE may be disabled when the level of the output signal OUT is substantially the same as the voltage level of the analog reference signal VAREF.

In an example embodiment, the analog reference signal VAREF may correspond to an analog ground voltage and the digital reference code DRC may correspond to a digital ground level. In another example embodiment, the analog reference signal VAREF may correspond to a level of the driving voltage divided by N and the digital reference code DRC may correspond to a digital level of the driving voltage divided by N, where N is a natural number.

In a conventional audio amplifier, when an output signal swings between a power supply voltage VDD and a ground voltage GND, the conventional audio amplifier needs to include a capacitor for cancelling a DC current component and the conventional audio amplifier has relatively large size. When the output signal swings between a positive power supply voltage +VDD and a negative power supply voltage −VDD, the audio amplifier may need not include the capacitor and have relatively small size because an average of the output signal corresponds to the ground voltage GND. However, if the mismatch between the positive and negative power supply voltages +VDD and −VDD or the mismatch due to resistance of the elements included in the driving unit 300 is caused, the output signal may have some offset components due to such mismatches. In the audio amplifier 10 according to some example embodiments, the calibration unit 500 generates the digital approximation code DAP corresponding to a digital level of the offset of the output signal OUT and the compensation unit 100 generates the compensation signal CIN, which corresponds to a compensated digital input signal, based on the digital approximation code DAP. Thus, the audio amplifier 10 according to some example embodiments may effectively compensate the offset of the output signal OUT due to the mismatches.

Figure 2A:
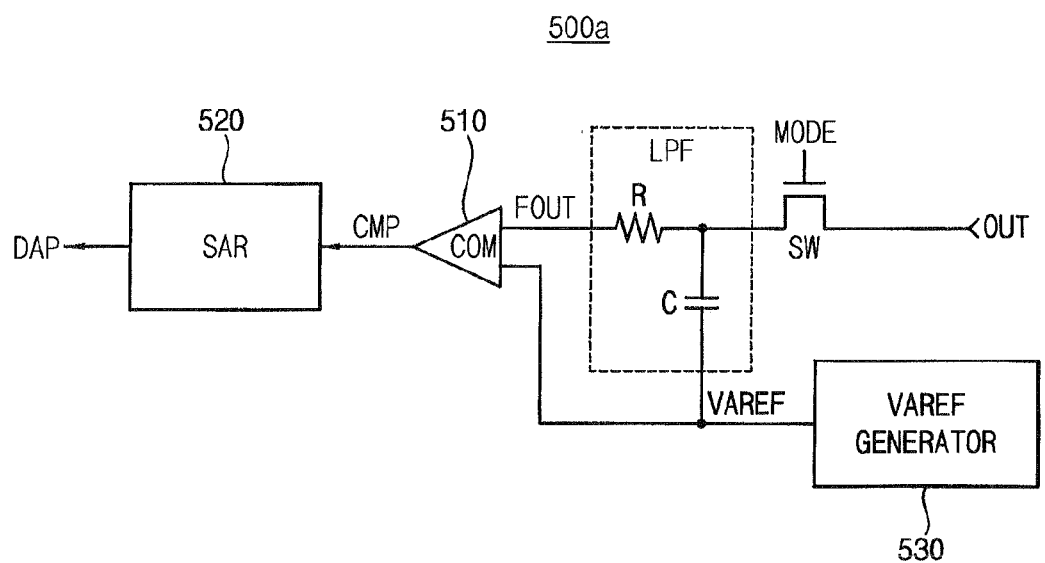
FIG. 2A is a block diagram illustrating an example of a calibration unit included in the audio amplifier of FIG. 1.

FIG. 2A is a block diagram illustrating an example of calibration unit 500a included in the audio amplifier 10 of FIG. 1.

Referring to FIG. 2A, the calibration unit 500a may include a low pass filter LPF, a comparator 510 and a successive approximation register 520. The calibration unit 500a may further include a switch SW. The switch SW transfers the output signal OUT to the low pass filter LPF in response to the mode signal MODE. The calibration unit 500a is enabled in response to the mode signal MODE.

The low pass filter LPF may include a resistor R and a capacitor C. When the output signal OUT is received through the switch SW, the low pass filter LPF filters the output signal OUT and provides the filtered output signal FOUT to the comparator 510.

The comparator 510 may compare the filtered output signal FOUT with the analog reference signal VAREF to generate a comparison signal CMP. For example, when a voltage level of the filtered output signal FOUT is higher than a voltage level of the analog reference signal VAREF, a logic level of the comparison signal CMP may correspond to a logic high level. When the voltage level of the filtered output signal FOUT is lower than the voltage level of the analog reference signal VAREF, the logic level of the comparison signal CMP may correspond to a logic low level. The comparator 510 may operate in synchronization with the clock signal.

The successive approximation register 520 generates the digital approximation code DAP based on the comparison signal CMP. For example, the digital approximation code DAP may be a binary digital code, the number of bits of which may be eight. The successive approximation register 520 may generate the bits of the digital approximation code DAP sequentially from the MSB to the LSB. In an example embodiment, when all bits of the digital approximation code DAP are determined, the mode signal MODE may be disabled. However, in another example embodiment, although some bits of the digital approximation code DAP is not determined, the mode signal MODE may be disabled by an external device and the audio amplifier 10 of FIG. 1 may operate in the normal mode. An operation for generating the digital approximation code DAP will be described later with reference to FIG. 4.

The calibration unit 500a may further include an analog reference voltage generator 530. The analog reference voltage generator 530 generates the analog reference signal VAREF corresponding to the digital reference code DRC. For example, the analog reference signal VAREF may correspond to the analog ground voltage when the digital reference code DRC corresponds to the digital ground level. In other examples, the analog reference signal VAREF may correspond to an analog power supply voltage when the digital reference code DRC corresponds to the digital power supply level. An example of a configuration of the analog reference voltage generator 530 will be described later with reference to FIG. 7.

Figure 2B:
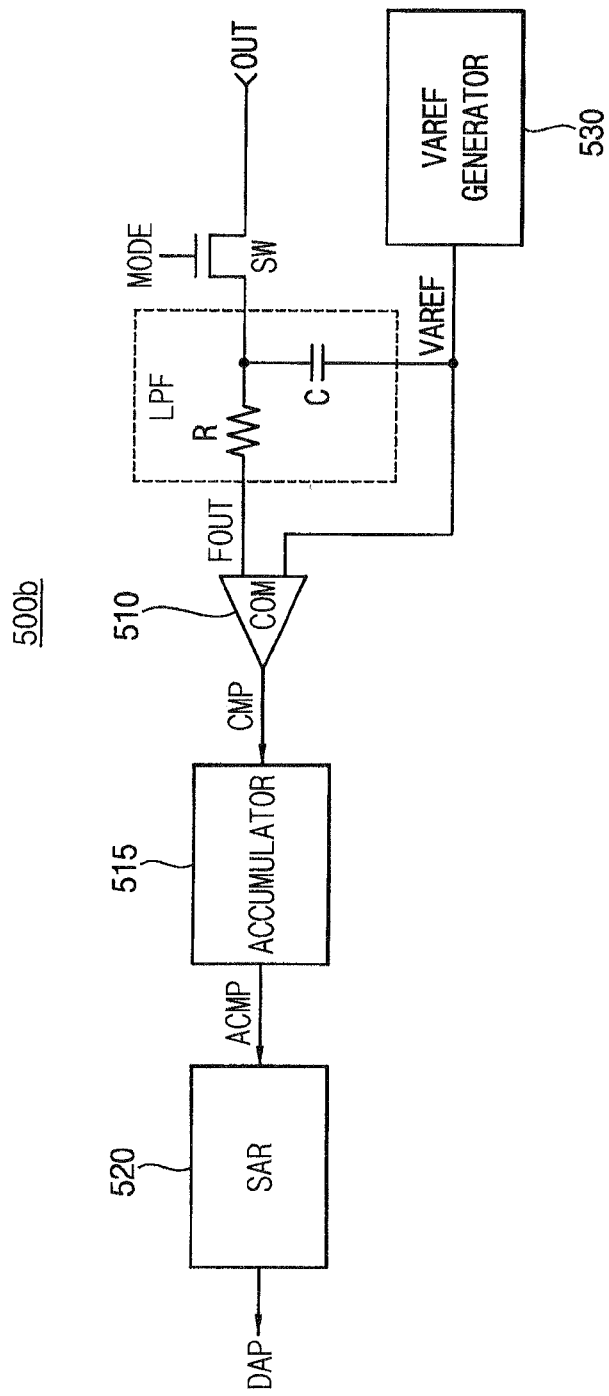
FIG. 2B is a block diagram illustrating another example of the calibration unit included in the audio amplifier of FIG. 1.

FIG. 2B is a block diagram illustrating another example of calibration unit 500b included in the audio amplifier 10 of FIG. 1.

Referring to FIG. 2B, the calibration unit 500b may include a low pass filter LPF, a comparator 510, an accumulator 515 and a successive approximation register 520.

Compared with the calibration unit 500a of FIG. 2A, the calibration unit 500b further includes the accumulator 515. An operation of the calibration unit 500b of FIG. 2B is substantially the same as the operation of the calibration unit 500a of FIG. 2A except for further including the accumulator 515. Thus, in FIG. 2B, the same reference numerals will be used to refer the same or like elements in FIG. 2A, and any further explanation will be omitted.

The accumulator 515 may accumulate the comparison signal CMP during a predetermined time period to provide an accumulated comparison signal ACMP to the successive approximation register 520. For example, when the logic level of the comparison signal CMP is the logic high level, the accumulator 515 may accumulate "+1", and when the logic level of the comparison signal CMP is the logic low level, the accumulator 515 may accumulate "−1". The accumulator 515 may output a sign of the accumulated result as the accumulated comparison signal ACMP.

In the calibration unit 500a of FIG. 2A, if the comparator 510 temporarily malfunctions or the voltage level of the filtered output signal FOUT is abnormal due to noise, the comparator 510 may generate the comparison signal. CMP having an error level. When the comparison signal CMP has the error level, the successive approximation register 520 may also generate the digital approximation code DAP having an error bit. Because of the error of the digital approximation code DAP, the measurement time of the DC offset of the output signal OUT may increase and the audio amplifier 10 of FIG. 1 may not effectively perform the compensation operation.

In the calibration unit 500b of FIG. 2B, the error of the digital approximation code DAP may be reduced by using the accumulator 515. For example, when the voltage level of the filtered output signal FOUT is lower than the voltage level of the analog reference signal VAREF, the logic level of the comparison signal CMP may be the logic low level. However, the logic level of the comparison signal CMP may be temporarily the logic high level due to noise. Even while the logic level of the comparison signal CMP is temporarily the logic high level, the accumulated comparison signal ACMP may have a value corresponding to the logic low level because the accumulator 515 accumulates the comparison signal CMP during the predetermined time, e.g., a predetermined period of the clock signal. Thus, the error of the digital approximation code DAP due to noise may be reduced.

The successive approximation register 520 generates the digital approximation code DAP based on the accumulated comparison signal ACMP. Even though the comparison signal CMP temporarily has the error level due to noise, the accumulated comparison signal ACMP may have the desirable value, and thus the successive approximation register 520 may be less affected by noise.

Figure 2C:
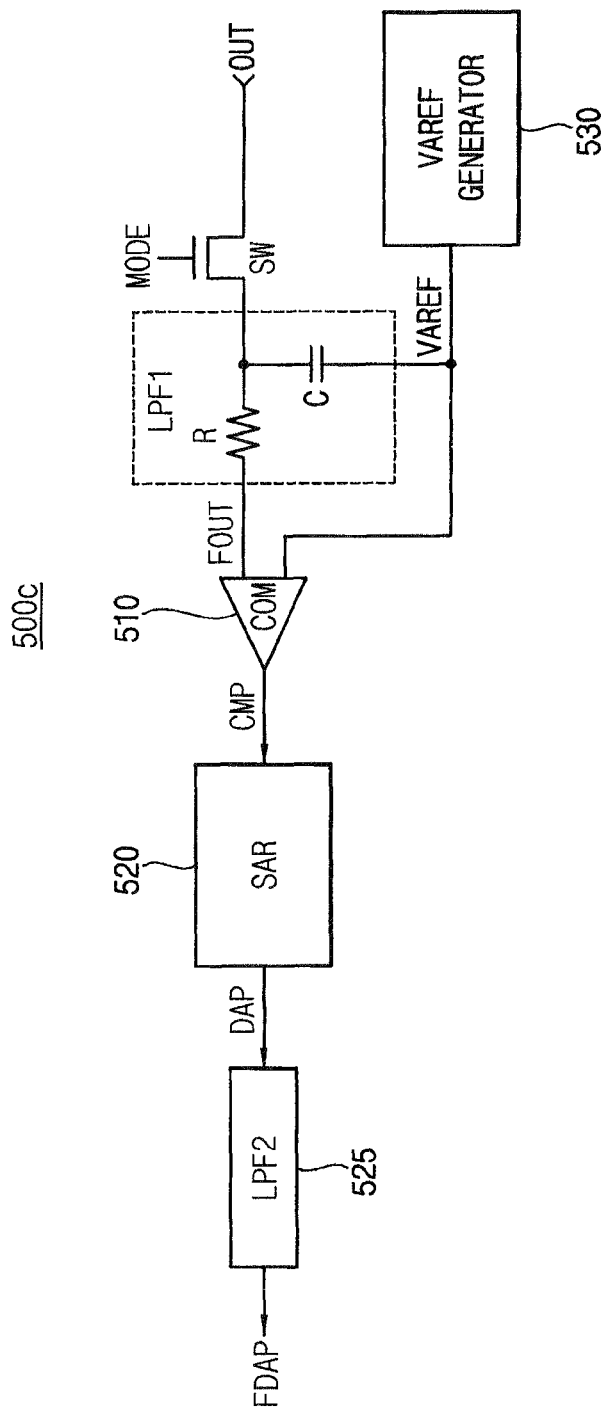
FIG. 2C is a block diagram illustrating still another example of the calibration unit included in the audio amplifier of FIG. 1.

FIG. 2C is a block diagram illustrating still another example of calibration unit 500c included in the audio amplifier 10 of FIG. 1.

Referring to FIG. 2C, the calibration unit 500e may include a first low pass filter LPF1, a comparator 510, a successive approximation register 520 and a second low pass filter LPF2.

Compared with the calibration unit 500a of FIG. 2A, the calibration unit 500e further includes the second low pass filter LPF2. An operation of the calibration unit 500c of FIG. 2C is substantially the same as the operation of the calibration unit 500a of FIG. 2A except for further including the second low pass filter LPF2. Thus, in FIG. 2C, the same reference numerals will be used to refer the same or like elements in FIG. 2A, and any further explanation will be omitted.

The second low pass filter LPF2 averages and filters the digital approximation code DAP to generate the filtered digital approximation code FDAP. In an example embodiment, the second low pass filter LPF2 may be a digital low pass filter using digital signal process.

Figure 3A:
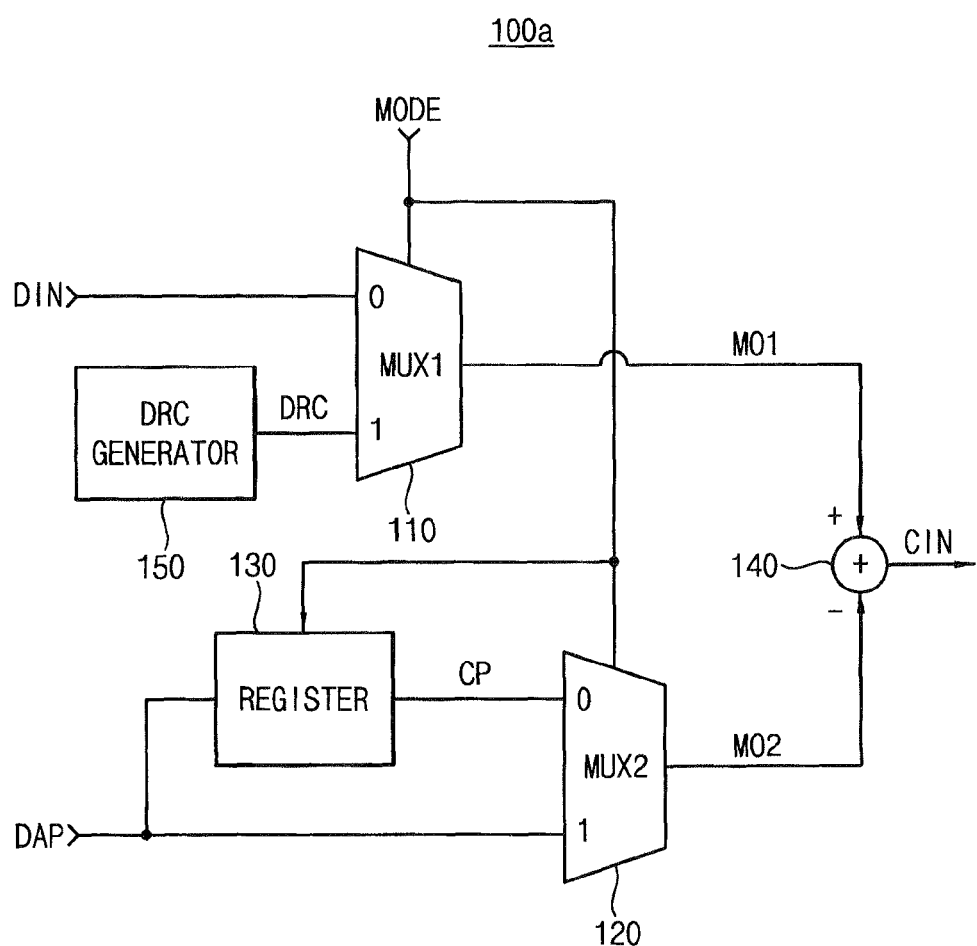
FIG. 3A is a block diagram illustrating an example of a compensation unit included in the audio amplifier of FIG. 1.

FIG. 3A is a block diagram illustrating an example of a compensation unit 100a included in the audio amplifier 10 of FIG. 1.

Referring to FIG. 3A, the compensation unit 100a may include a first multiplexer 110, a second multiplexer 120, a register 130 and a subtractor 140. The compensation unit 100a may further include a digital reference code generator 150.

The first multiplexer 110 may output one of the digital reference code DRC and the digital input signal DIN in response to the mode signal MODE. For example, when the mode signal MODE is enabled (i.e., in the calibration mode), the first multiplexer 110 may output the digital reference code DRC. When the mode signal MODE is disabled (i.e., in the normal mode), the first multiplexer 110 may output the digital input signal DIN. The digital reference code DRC may be generated from the digital reference code generator 150.

The second multiplexer 120 may output one of the digital approximation code DAP and the compensation code CP stored in the register 130 in response to the mode signal MODE. For example, when the mode signal MODE is enabled, the first multiplexer 110 may output the digital approximation code DAP. When the mode signal MODE is disabled, the first multiplexer 110 may output the compensation code CP. The compensation code CP may be substantially the same as the digital approximation code DAP at the timing point when the mode signal MODE is disabled.

The bits of the digital approximation code DAP is sequentially generated by the calibration unit 500 of FIG. 1, and the digital approximation code DAP may have different values depending on the operation mode of the audio amplifier 10 of FIG. 1. The compensation unit 100a may generate the compensation signal CIN based on the digital approximation code DAP in the calibration mode.

The register 130 stores the digital approximation code DAP as the compensation code CP. The value of the compensation code CP may be fixed at a timing point when the operation of the successive approximation register 520 included in the calibration unit 500 of FIG. 1 is completed. For example, when the mode signal MODE is disabled, the calibration unit 500 of FIG. 1 is disabled and the digital approximation code DAP is fixed, and thus the value of the compensation code CP is fixed to the value of the digital approximation code DAP at the timing point when the mode signal MODE is disabled. The compensation code CP may be a digital code corresponding to the compensation level of the output signal OUT. In the normal mode, the compensation unit 100a may generate the compensation signal CIN by using the digital input signal DIN and the compensation code CP and the DC offset of the output signal OUT may be compensated.

The subtractor 140 generates the compensation signal CIN by subtracting an output signal MO2 of the second multiplexer 120 from an output signal MO1 of the first multiplexer 110. For example, in the calibration mode, the subtractor 140 generates the compensation signal CIN by subtracting the digital approximation code DAP from the digital reference code DRC. Although the value of the digital reference code DRC is fixed, the value of the compensation signal CIN may be changed during the calibration mode because the bits of the digital approximation code DAP are generated sequentially by the calibration unit 500 of FIG. 1.

In the normal mode, the subtractor 140 generates the compensation signal CIN by subtracting the digital input signal DIN from the compensation code CP. That is, the subtractor 140 may generate the compensation signal. CIN in a reverse manner to the operation for generating the compensation signal CIN in the calibration mode. The compensation code CP may have a fixed value that has a magnitude corresponding to an absolute value of the offset of the output signal OUT and a sign corresponding to an opposite sign of the offset of the output signal OUT. The subtractor 140 may adjust the offset of the digital input signal DIN to generate the compensation signal CIN, and thus the offset of the output signal OUT may be compensated.

Figure 3B:
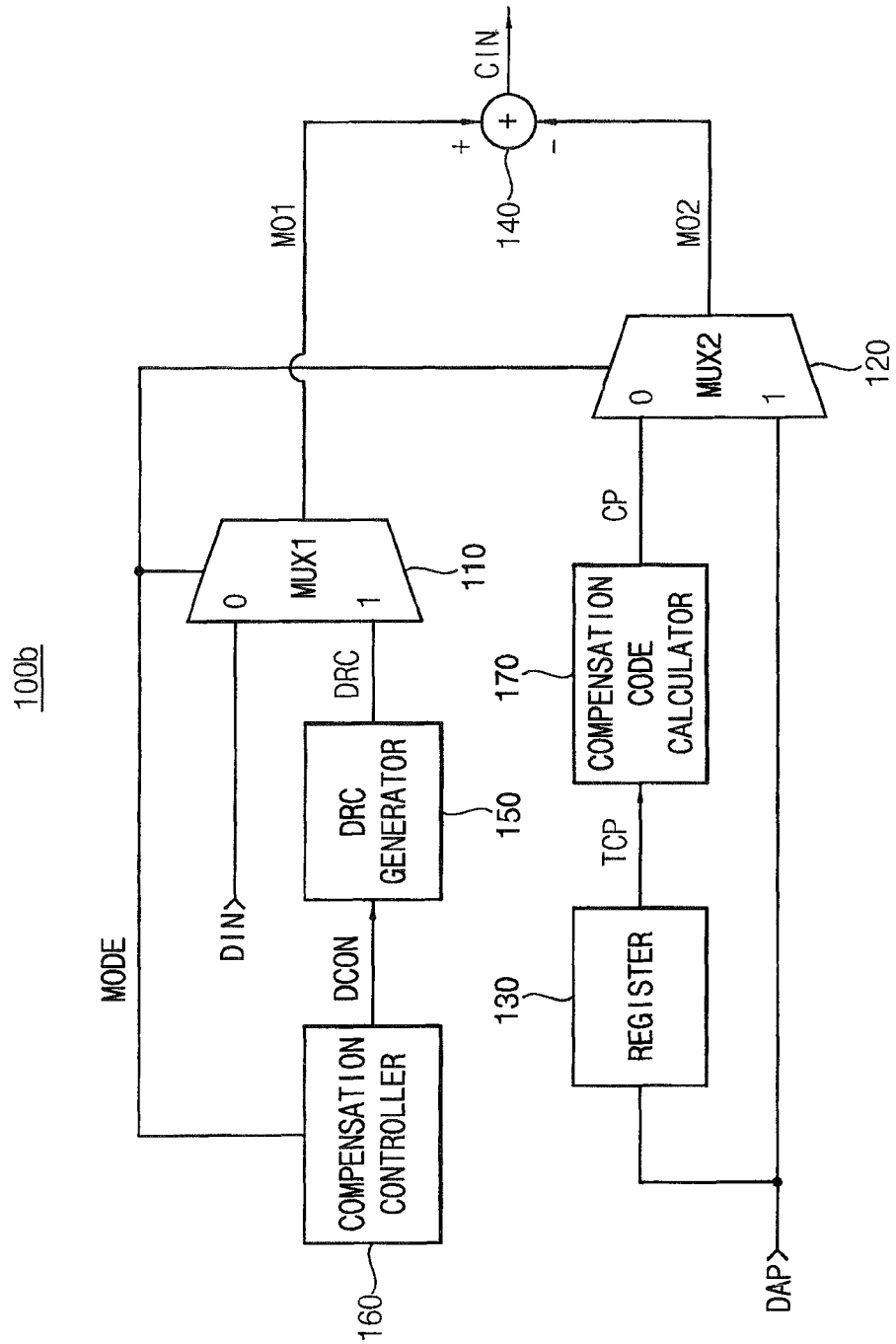
FIG. 3B is a block diagram illustrating another example of the compensation unit included in the audio amplifier of FIG. 1.

FIG. 3B is a block diagram illustrating another example of a compensation unit 100b included in the audio amplifier 10 of FIG. 1.

Referring to FIG. 3B, the compensation unit 100b may include a first multiplexer 110, a second multiplexer 120, a register 130, a subtractor 140, a digital reference code generator 150, a compensation controller 160 and a compensation code calculator 170. Compared with the compensation unit 100a of FIG. 3A, the compensation unit 100b further includes the compensation controller 160 and the compensation code calculator 170.

The compensation controller 160 may generate a digital control signal DCON for controlling the digital reference code generator 150 and the mode signal MODE for determining the operation mode of the audio amplifier 10 of FIG. 1. The compensation controller 160 may provide the mode signal MODE to the calibration unit 500 included in the audio amplifier 10 of FIG. 1. The digital reference code generator 150 may generate the digital reference code DRC based on the digital control signal DCON.

In an example embodiment, when the digital reference code generator 150 may generate the digital reference code DRC corresponding to the digital level of the driving voltage divided by N, the calibration unit 500 of FIG. 1 generates the digital approximation code DAP by using the successive approximation method and provides the digital approximation code DAP to the compensation unit 100b. When all bits of the digital approximation code DAP are determined, the compensation controller 160 may disable the mode signal MODE.

In an example embodiment, the driving voltage may include a first driving voltage VDD1 and a second driving voltage VDD2. For example, the first driving voltage VDD1 may be a positive power supply voltage +VDD and the second driving voltage VDD2 may be a negative power supply voltage −VDD. In this case, the digital reference code DRC may include a first digital reference code corresponding to a digital level of the first driving voltage VDD1 divided by N and a second digital reference code corresponding to a digital level of the second driving voltage VDD2 divided by N, where N is a natural number. The digital reference code generator 150 may generate the first digital reference code based on the digital control signal DCON. The register 130 may store the digital approximation code DAP generated base on the first digital reference code as a first compensation code CP1 and provides the first compensation code CP1 to the compensation code calculator 170 as a temporary compensation code TCP. The mode signal MODE may be maintained in the enabled state even after the first compensation code CP1 is generated, and the digital reference code generator 150 may generate the second digital reference code based on the digital control signal DCON. The register 130 may store the digital approximation code DAP generated base on the second digital reference code as a second compensation code CP2 and provides the second compensation code CP2 to the compensation code calculator 170 as a temporary compensation code TCP. The compensation unit 100b may generate the first and second compensation codes CP1 and CP2 for each of first and second driving voltages VDD1 and VDD2, and thus effectively compensate the offset of the output signal OUT.

The compensation code generator 170 may generate the compensation code CP based on at least one of the temporary compensation codes TCP. For example, the compensation code CP may be generated by adding the first compensation code CP1 to the second compensation code CP2. In an example embodiment, each of the temporary compensation codes TCP is provided to the driving unit 300 of FIG. 1 without performing any calculation. Operations of the temporary compensation codes TCP in the driving unit 300 of FIG. 1 will be described later with reference to FIG. 5.

When the mode signal MODE is disabled by the compensation controller 160, the compensation code CP is fixed and the audio amplifier 10 of FIG. 1 may operate in the normal mode. The first multiplexer 110 outputs the digital input signal DIN and the second multiplexer 120 outputs the compensation code CP.

The subtractor 140 may generate the compensation signal CIN based on the output signal MO1 of the first multiplexer 110 and the output signal MO2 of the second multiplexer 120. For example, the subtractor 140 may generate the compensation signal CIN by subtracting the output signal MO2 of the second multiplexer 120 from the output signal MO1 of the first multiplexer 110.

Operations of each of the first and second multiplexers 110 and 120 and the subtractor 140 included in the compensation unit 100b of FIG. 3B is substantially the same as each of the first and second multiplexers 110 and 120 and the subtractor 140 included in the compensation unit 100a of FIG. 3A.

Figure 4:
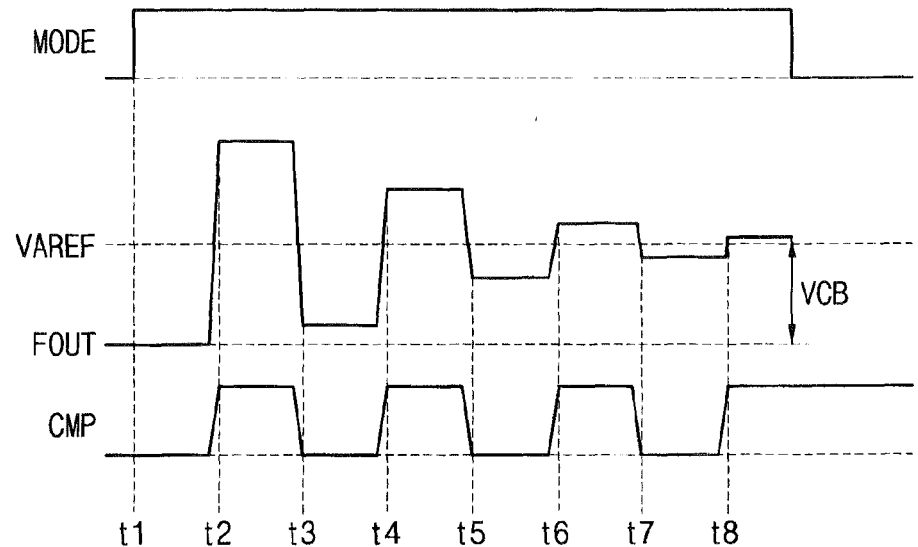
FIG. 4 is a diagram illustrating an operation of the audio amplifier of FIG. 1.
Figure 4:
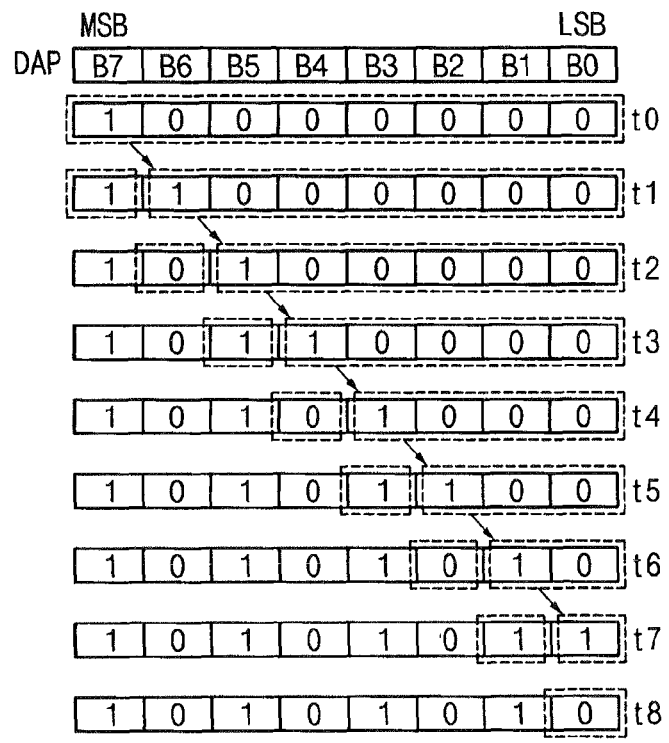

FIG. 4 is a diagram illustrating an operation of the audio amplifier 10 of FIG. 1.

Hereinafter, the operation of the audio amplifier 10 according to an example embodiment is described with reference to FIGS. 1 through 4.

In FIG. 4, the digital approximation code DAP may be a binary digital code, the number of bits of which may be eight. The digital approximation code DAP may be initialized to "10000000".

At time t1, the mode signal MODE is enabled and the calibration unit 500 is enabled. In the calibration unit 500, the switch SW provides the output signal OUT to the low pass filter LPF. The low pass filter LPF filters the output signal OUT to provide the filtered output signal FOUT to the comparator 510. The comparator 510 compares the filtered output signal FOUT with the analog reference signal VAREF to generate the comparison signal CMP. The comparison signal CMP may have the logic high level or the logic low level depending on the voltage level of the filtered output signal FOUT. The logic level of the comparison signal CMP corresponds to the logic low level at the time t1 because the voltage level of the filtered output signal FOUT is lower than the voltage level of the analog reference signal VAREF (i.e., a negative offset).

In a first approximation process, it is required to change the negative offset to a positive offset for compensating the output signal OUT. The successive approximation register 520 determines the logic level of the MSB (i.e., an eighth bit B7) of the digital approximation code DAP to the logic high level (i.e., "1") by inverting the logic level of the comparison signal CMP. The successive approximation register 520 also determines the logic levels of the other bits of the digital approximation code DAP by one-bit shifting the initial digital approximation code DAP. For example, a bit next to the MSB of the digital approximation code DAP at time t1 may correspond to the MSB of the initial digital approximation code DAP. That is, a seventh bit (B6) of the digital approximation code DAP at time t1 may correspond to the MSB (B7) of the initial digital approximation code DAP and a sixth bit (B5) of the digital approximation code DAP at the time t1 may correspond to a seventh bit (B6) of the initial digital approximation code DAP. Thus, after the first approximation process, the value of the digital approximation code DAP at the time t1 corresponds to "11000000". The compensation unit 100 of FIG. 1 generates the compensation signal CIN based on the digital approximation code DAP, the value of which is "11000000". The compensation signal CIN may be generated by subtracting the digital approximation code DAP from the digital reference code DRC. The compensation signal CIN passes through the modulator 200, the driving unit 300 and the low pass filter 400 and is provided to the calibration unit 500 as the output signal OUT.

At time t2, the logic level of the comparison signal CMP corresponds to the logic high level because the voltage level of the filtered output signal FOUT is higher than the voltage level of the analog reference signal VAREF (i.e., the positive offset). Thus, in a second approximation process, it is required to change the positive offset to the negative offset for compensating the output signal OUT. The successive approximation register 520 determines the logic level of the bit next to the MSB of the digital approximation code DAP to the logic low level (i.e., "0") by inverting the logic level of the comparison signal CMP, and determines the logic level of the MSB of the digital approximation code DAP to be the same as the logic level of the MSB of the digital approximation code DAP at the time t1. The successive approximation register 520 also determines the logic levels of the other bits of the digital approximation code DAP by two-bits shifting the initial digital approximation code DAP. For example, a sixth bit (B5) of the digital approximation code DAP at the time t2 may correspond to the MSB (B7) of the initial digital approximation code DAP. Thus, after the second approximation process, the value of the digital approximation code DAP at the time t2 corresponds to "10100000". The compensation unit 100 of FIG. 1 generates the compensation signal CIN based on the digital approximation code DAP, the value of which corresponds to "10100000". The compensation signal CIN passes through the modulator 200, the driving unit 300 and the low pass filter 400 and is provided to the calibration unit 500 as the output signal OUT.

The audio amplifier 10 of FIG. 1 may repeatedly perform the approximation processes to gradually reduce the adjustment level and may compensate the offset of the output signal OUT. In an example embodiment, the adjustment level may be gradually reduced by a half because the digital approximation code DAP is a binary digital code.

When all bits of the digital approximation code DAP are determined based on the comparison signal CMP, the mode signal MODE is disabled. In FIG. 4, the final value of the digital approximation code DAP corresponds to "10101010" and a value VCB indicates the compensation level. The compensation unit 100 stores the value of the digital approximation code DAP as the compensation code CP at the timing point when the mode signal MODE is disabled (e.g., "10101010").

In the audio amplifier 10 according to the example embodiments, the output signal OUT may repeatedly compensated by using the successive approximation method, and thus the audio amplifier 10 according to the example embodiments may effectively perform the compensation operation.

Figure 5:
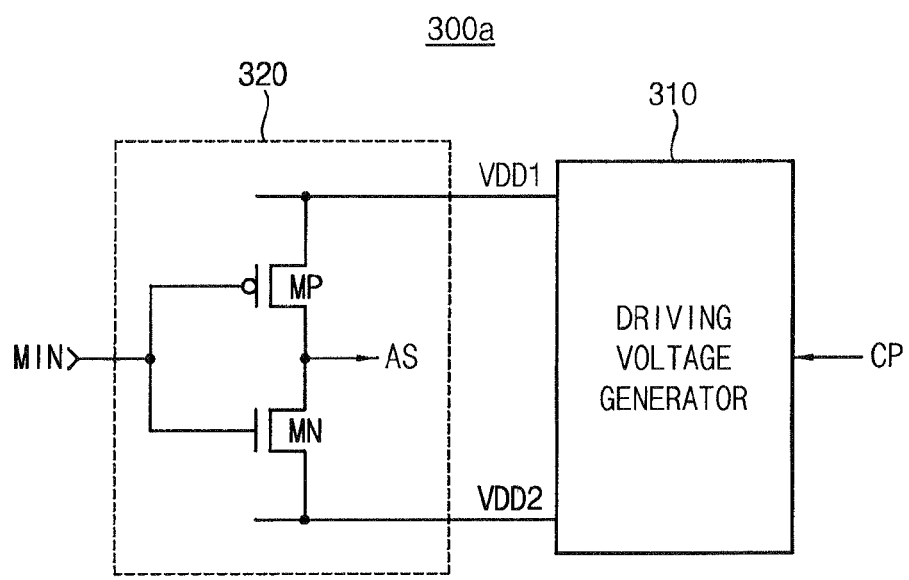
FIG. 5 is a block diagram illustrating an example of the driving unit included in the audio amplifier of FIG. 1.

FIG. 5 is a block diagram illustrating an example of the driving unit 300a included in the audio amplifier of FIG. 1.

Referring to FIG. 5, the driving unit 300a may include a driving voltage generator 310 and a driving circuit 320.

The driving voltage generator 310 may generate the driving voltage based on the compensation code CP. The driving voltage may include a first driving voltage VDD1 and a second driving voltage VDD2. In an example embodiment, the first driving voltage VDD1 may correspond to the positive power supply voltage +VDD and the second driving voltage VDD2 may correspond to the negative power supply voltage −VDD. The sum of the first driving voltage VDD1 and the second driving voltage VDD2 may correspond to the ground voltage GND. That is, the sum of the first and second driving voltages VDD1 and VDD2 may correspond to the value calculated by subtracting the compensation code CP from the digital reference code DRC. For example, when the negative offset is caused, the driving voltage generator 310 may increase a level of the first driving voltage VDD1 and when the positive offset is caused, the driving voltage generator 310 may decrease a level of the second driving voltage VDD2.

In an example embodiment, the driving voltage generator 310 may receive the temporary compensation codes TCP from the compensation unit 100b of FIG. 3B and control each of the levels of the first and second driving voltages VDD1 and VDD2. For example, when the digital reference code DRC corresponds to the digital level of the first driving voltage VDD1 divided by N, the driving voltage generator 310 may control the level of the first driving voltage VDD1 based on the first compensation code CP1. When the digital reference code DRC corresponds to the digital level of the second driving voltage VDD2 divided by N, the driving voltage generator 310 may control the level of the second driving voltage VDD2 based on the second compensation code CP2.

The driving circuit 320 may include a P-type metal oxide semiconductor (PMOS) transistor MP and a N-type metal oxide semiconductor (NMOS) transistor MN. The PMOS transistor MP and the NMOS transistor MN are connected in serial between the first and second voltages VDD1 and VDD2.

The PMOS transistor MP has a first electrode (e.g., a source) connected to the first power supply voltage VDD1, a gate electrode receiving the modulation signal MIN and a second electrode (e.g., a drain) outputting the amplification signal AS. The NMOS transistor MN has a first electrode (e.g., a source) connected to the second power supply voltage VDD2, a gate electrode receiving the modulation signal MIN and a second electrode (e.g., a drain) connected to the second electrode of the PMOS transistor MP. The second electrode of the PMOS transistor MP and the second electrode of the NMOS transistor MN are connected to the low pass filter 400 of FIG. 1. When a logic level of the modulation signal MIN corresponds to the logic high level, the NMOS transistor MN is turned on, the PMOS transistor MP is turn off, and the driving circuit 320 outputs the amplification signal AS corresponding to the second driving voltage VDD2. When the logic level of the modulation signal. MIN corresponds to the logic low level, the NMOS transistor MN is turned off, the PMOS transistor MP is turn on, and the driving circuit 320 outputs the amplification signal AS corresponding to the first driving voltage VDD1.

The driving unit 300a may adjust the level of the driving voltage based on the compensation code CP. Thus, the audio amplifier 10 may prevent the mismatch between the first and second driving voltages VDD1 and VDD2 and effectively compensate the offset of the output signal OUT.

Figure 6A:
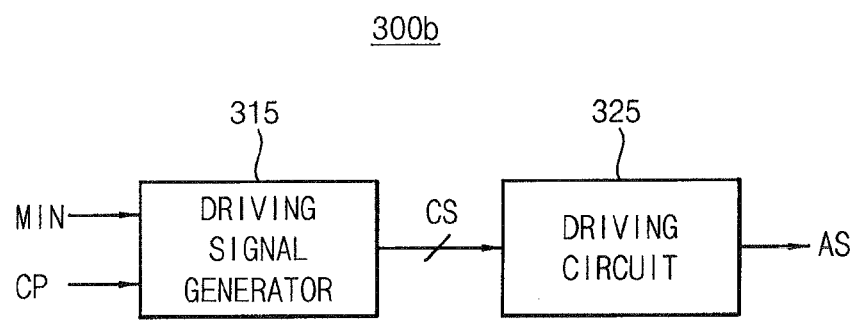
FIG. 6A is a block diagram illustrating another example of the driving unit included in the audio amplifier of FIG. 1.

FIG. 6A is a block diagram illustrating another example of a driving unit 300b included in the audio amplifier 10 of FIG. 1.

Referring to FIG. 6A, the driving unit 300b may include a driving signal generator 315 and a driving circuit 325.

The driving signal generator 315 generates compensation driving signals CS based on the compensation code CP and the modulation signal MIN. The driving circuit 325 receives the compensation driving signals CS to generate the amplification signal AS. In the driving unit 300b according to some example embodiments, the mismatch due to resistance of the transistors included in the driving circuit 325 may be adjusted based on the compensation driving signals CS, thereby improving linearity and reliability characteristics of the audio amplifier 10 of FIG. 1. An Operation for compensating the mismatch due to the resistance of the transistors included in the driving circuit 325 will be described later with reference to FIG. 6B.

Figure 6B:
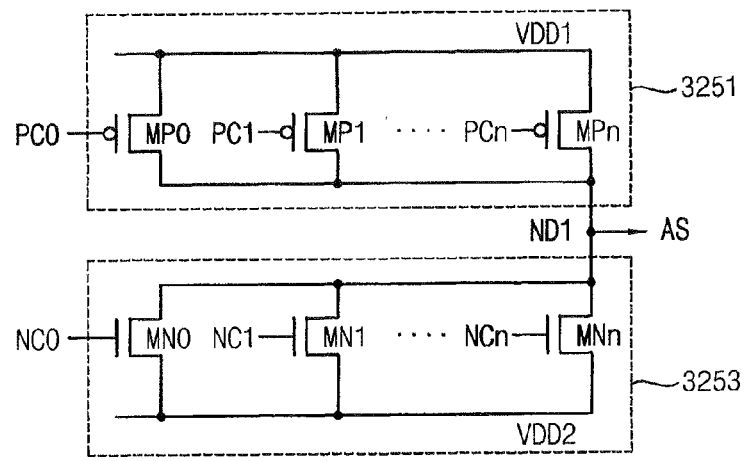
FIG. 6B is a circuit diagram illustrating an example of a driving circuit included in the driving unit of FIG. 6A.

FIG. 6B is a circuit diagram illustrating an example of a driving circuit 325 included in the driving unit 300b of FIG. 6A.

Referring to FIG. 6B, the driving circuit 325 may include a PMOS transistor array 3251 and a NMOS transistor array 3253. The PMOS transistor array 3251 and the NMOS transistor array 3253 are connected in serial between the first driving voltage VDD1 and the second driving voltage VDD2. In FIG. 6B, the driving circuit 325 may be implemented with a class-D amplifier.

The driving circuit 325 may receive the compensation driving signal CS from the driving signal generator 315 of FIG. 6A. The compensation driving signal CS may include a plurality of PMOS compensation driving signals PC0, PC1, . . . , PCn and a plurality of NMOS compensation driving signals NC0, NC1, . . . , NCn. In an example embodiment, the compensation driving signal CS may further include the driving voltage. In another example embodiment, the driving voltage may be generated the driving voltage generator based on the compensation code CP, as illustrated in FIG. 5. The driving voltage may include the first driving voltage VDD1 and the second driving voltage VDD2. The driving circuit 325 generates the amplification signal AS based on the compensation driving signal CS and provides the amplification signal AS to the low pass filter 400 of FIG. 1.

The PMOS transistor array 3251 may include a plurality of PMOS transistors MP0, MP1, . . . , MPn connected in parallel between the first driving voltage VDD1 and a first node ND1. Each of the PMOS transistors MP0, MP1, . . . , MPn receives one of the PMOS compensation driving signals PC0, PC1, . . . , PCn corresponding to one of the PMOS transistors MP0, MP1, . . . , MPn. For example, a first PMOS transistor MP0 has a first electrode (e.g., a source) connected to the first driving voltage VDD1, a gate electrode receiving a first PMOS compensation driving signal PC0 and a second electrode (e.g., a drain) connected to the first node ND1. Configurations of the other PMOS transistors MP1, . . . , MPn are substantially the same as the configuration of the first PMOS transistor MP0 except for receiving one of the other PMOS compensation driving signals PC1, . . . , PCn.

The NMOS transistor array 3253 may include a plurality of NMOS transistors MN0, MN1, . . . , MNn connected in parallel between the first node ND1 and the second driving voltage VDD2. Each of the NMOS transistors MN0, MN1, . . . , MNn receives one of the NMOS compensation driving signals NC0, NC1, . . . , NCn corresponding to one of the NMOS transistors MN0, MN1, . . . , MNn. For example, a first NMOS transistor MN0 has a first electrode (e.g., a source) connected to the second driving voltage VDD2, a gate electrode receiving a first NMOS compensation driving signal NC0 and a second electrode (e.g., a drain) connected to the first node ND1. Configurations of the other NMOS transistors MN1, . . . , MNn are substantially the same as the configuration of the first NMOS transistor MN0 except for receiving one of the other NMOS compensation driving signals NC1, . . . , NCn.

In the PMOS transistor array 3251, the plurality of PMOS transistors MP0, MP1, . . . , MPn are switched (i.e., turned on or off) in response to the plurality of PMOS compensation driving signals PC0, PC1, . . . , PCn, respectively. The number of turned-on PMOS transistors may be determined based on the logic level of the modulation signal MIN and the compensation code CP. For example, when the logic level of the modulation signal MIN is logic high level, the PMOS compensation driving signals PC0, PC1, . . . , PCn may be set to be turned on one of the PMOS transistors MP0, MP1, . . . , MPn. When the logic level of the modulation signal MIN is logic low level, the PMOS compensation driving signals PC0, PC1, . . . , PCn may be set to be turned on all of the PMOS transistors MP0, MP1, . . . , MPn. The resistance of the PMOS transistor array 3251 may be determined based on the number of turned-on PMOS transistors. For example, when the number of turned-on PMOS transistors decreases, the resistance of the PMOS transistor array 3251 may be reduced.

In the NMOS transistor array 3253, the plurality of NMOS transistors MN0, MN1, . . . , MNn are switched (i.e., turned on or off) in response to the plurality of NMOS compensation driving signals NC0, NC1, . . . , NCn, respectively. An Operation of the NMOS transistor array 3253 is substantially the same as the operations of the PMOS transistor array 3251 except for being controlled based on the NMOS compensation driving signals NC0, NC1, . . . , NCn.

In an example embodiment, each of the PMOS compensation driving signals PC0, PC1, . . . , PCn may be substantially the same as one of the NMOS compensation driving signals NC0, NC1, . . . , NCn corresponding to one of the PMOS compensation driving signals PC0, PC1, . . . , PCn. For example, the first PMOS compensation driving signal PC0 may be substantially the same as the NMOS compensation driving signal NC0 because both of the PMOS and NMOS compensation driving signals PC0 and NC0 are generated based on the compensation code CP. In another example embodiment, each of the PMOS compensation driving signals PC0, PC1, . . . , PCn may be different from one of the NMOS compensation driving signals NC0, NC1, . . . , NCn corresponding to the one of the PMOS compensation driving signals PC0, PC1, . . . , PCn. For example, the first PMOS compensation driving signal PC0 may be different from the NMOS compensation driving signal NC0 because the PMOS compensation driving signal PC0 is generated based on the first compensation code CP1 and the NMOS compensation driving signal NC0 is generated based on the second compensation code CP2.

In an example embodiment, when the digital reference code DRC has the digital level corresponding to the positive power supply voltage +VDD, the driving signal generator 315 included in the driving unit 300$b$ of FIG. 6A generate may the PMOS compensation driving signals PC0, PC1, PCn based on the compensation code CP and the driving circuit 325 may turn on or off the PMOS transistors included in the PMOS transistor array 3251 to adjust the resistance of the PMOS transistor array 3251. In another example embodiment, when the digital reference code DRC has the digital level corresponding to the negative power supply voltage −VDD, the driving signal generator 315 included in the driving unit 300$b$ of FIG. 6A generate may the PMOS compensation driving signals NC0, NC1, . . . , NCn based on the compensation code CP and the driving circuit 325 may turn on or off the NMOS transistors included in the NMOS transistor array 3253 to adjust the resistance of the NMOS transistor array 3253.

The driving unit 300$b$ may adjust the number of turned-on transistors included in the driving circuit 325 based on the compensation driving signals CS. Thus, the audio amplifier 10 may prevent the mismatch due to the resistance of the transistors included in the driving circuit 325 and effectively compensate the offset of the output signal OUT.

Figure 7:
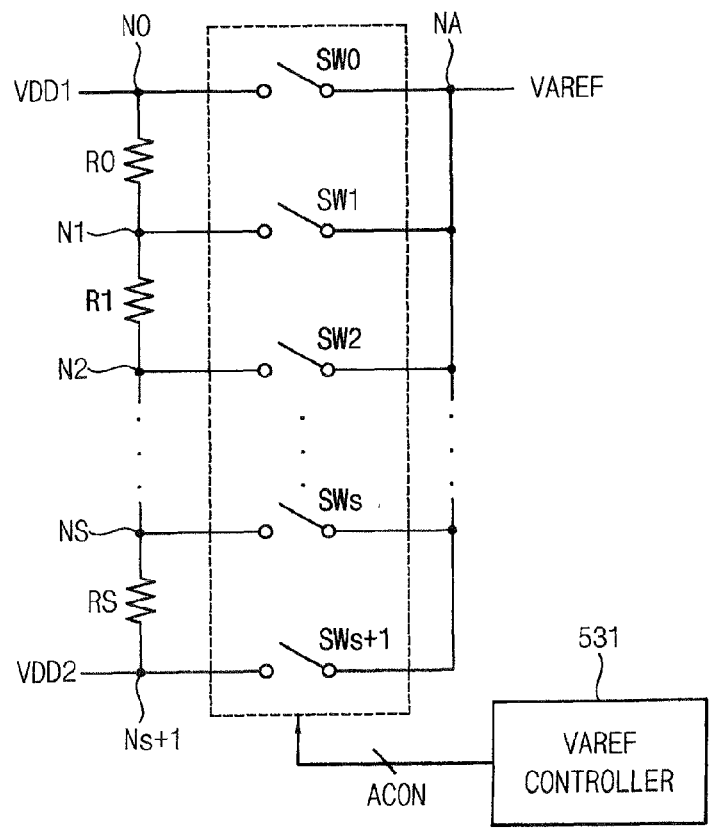
FIG. 7 is a circuit diagram illustrating an example of an analog reference signal generator included in the calibration units of FIGS. 2A, 2B and 2C.

FIG. 7 is a circuit diagram illustrating an example of an analog reference signal generator 530 included in the calibration units 500$a$, 500$b$ and 500$c$ of FIGS. 2A, 2B and 2C.

Referring to FIG. 7, the analog reference signal generator 530 may include a plurality of resistors R0, R1, . . . , Rs and a plurality of switches SW0, SW1, . . . , SWs, SWs+1. The plurality of resistors R0, R1, . . . , Rs are connected in serial between the first power supply voltage VDD1 and the second power supply voltage VDD2.

The first and second power supply voltages VDD1 and VDD2 may be substantially the same as the positive and negative power supply voltages +VDD and −VDD, respectively. The first and second power supply voltages VDD1 and VDD2 may correspond to the driving voltage generated from the driving unit 300 of FIG. 5 and may be adjusted based on the compensation code CP.

The analog reference signal generator 530 may further include an analog reference signal controller 531. The analog reference signal controller 531 generates an analog control signal ACON to provide the analog reference signal VAREF corresponding to the level of the driving voltage divided by N. Each of the switches SW0, SW1, . . . , SWs, SWs+1 selectively connects one of resistor nodes N0, N1, . . . , Ns, Ns+1 to an output node NA of the analog reference signal generator 530 in response to the analog control signal ACON. For example, when the analog reference signal VAREF corresponds to the positive power supply voltage +VDD, the analog reference signal controller 531 generates the analog control signal ACON to connect a first resistor node N0 to the output node NA.

In the audio amplifier 10 according to some example embodiments, the compensation code CP may be generated by the successive approximation method. The audio amplifier 10 according to some example embodiments may compensate the offset of the digital input signal DIN, adjust the level of the driving voltage and adjust the number of turned-on transistors included in the driving circuit 325. Thus, the offset of the output signal OUT may be effectively compensated, thereby reducing the quiescent current. In addition, the audio amplifier 10 may have improved linearity and reliability characteristics.

Figure 8:
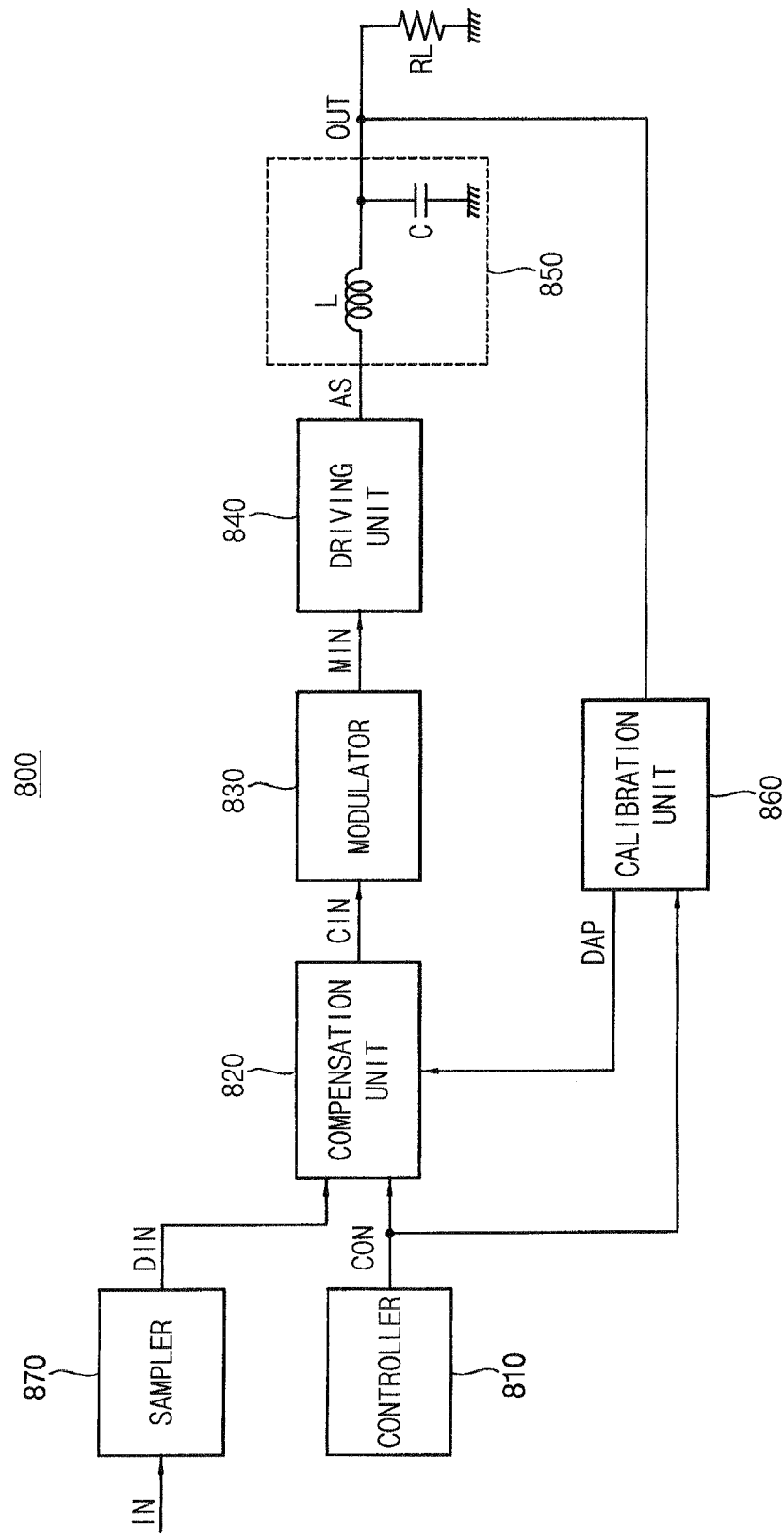
FIG. 8 is a block diagram illustrating an audio amplifier according to other example embodiments.

FIG. 8 is a block diagram illustrating an audio amplifier 800 according to other example embodiments.

Referring to FIG. 8, the audio amplifier 800 includes a controller 810, a compensation unit 820, a modulator 830, a driving unit 840, a low pass filter 850, a calibration unit 860 and an output load RL such as a speaker, microphone, etc.

The controller 810 generates a control signal CON to provide the compensation unit 820 and the calibration unit 860. The audio amplifier 800 determines operation mode and compensates an offset of an output signal OUT based on the control signal CON. For example, the control signal CON may include a mode signal MODE. The audio amplifier 800 may operate in a calibration mode or a normal mode based on the mode signal MODE. The compensation unit 820 may determine a digital level of a digital reference code DRC based on the control signal CON. The calibration unit 860 may determine an analog level of an analog reference signal VAREF based on the control signal CON. In an example embodiment, the controller 810 may provide the control signal CON to the driving unit 840 and the driving unit 840 may generate a driving voltage based on the control signal CON.

The compensation unit 820 may be the compensation unit 100$a$ of FIG. 3A or the compensation unit 100$b$ of FIG. 3B. In the calibration mode, the compensation unit 820 generates a compensation signal CIN based on the digital reference code DRC and a digital approximation code DAP. For example, the compensation unit 820 may generate the compensation signal CIN by subtracting the digital approximation code DAP from the digital reference code DRC. The digital approximation code DAP is generated from the calibration unit 860 and includes a plurality of bits that are generated sequentially. For example, the bits of the digital approximation code DAP may be sequentially determined in the calibration mode to measure the offset of the output signal OUT. A value of the digital reference code DRC is fixed in the calibration mode. In the normal mode, the compensation unit 820 generates the compensation signal CIN based on a digital input signal DIN and a compensation code CP. For example, the compensation unit 820 may generate the compensation signal CIN by subtracting the compensation code CP from the digital input signal DIN to perform the compensating operation. When the audio amplifier 10 operates in the normal mode, the digital approximation code DAP is stored as the compensation code CP and a value of the compensation code CP is fixed.

The modulator 830 modulates the compensation signal CIN to generate a modulation signal MIN and provides the modulation signal MIN to the driving unit 840.

The driving unit 840 may be the driving unit 300a of FIG. 5 or the driving unit 300b of FIG. 6A. The driving unit 840 is driven by the driving voltage, receives the modulation signal MIN and amplifies the modulation signal MIN to a level of the driving voltage to generate an amplification signal AS. The driving voltage may be a power supply voltage VDD and may include a positive power supply voltage +VDD and a negative power supply voltage −VDD according to some example embodiments. In an example embodiment, the driving voltage may be provided from an external device. In another example embodiment, the driving unit 840 may generate the driving voltage based on the control signal CON and the compensation code CP.

The low pass filter 850 filters the amplification signal AS to generate the output signal OUT and provides the output signal OUT to the output load RL and the calibration unit 860.

The calibration unit 860 may be the calibration unit 500a of FIG. 2A, the calibration unit 500b of FIG. 2B or the calibration unit 500c of FIG. 2C. The calibration unit 860 is enabled in response to the mode signal MODE included in the control signal CON. The calibration unit 860 filters the output signal OUT, compares the filtered output signal OUT with the analog reference signal VAREF in response to the control signal CON to generate a comparison signal and generates the digital approximation code DAP based on the comparison signal. The digital approximation code DAP includes a plurality of bits that are generated sequentially. In an example embodiment, the calibration unit 860 may generate the digital approximation code DAP by accumulating the comparison signal during a predetermined time period and performing the successive approximation method to the accumulated digital approximation code DAP. The calibration unit 860 may filter the digital approximation code DAP and provide the filtered digital approximation code DAP to the compensation unit 820.

The audio amplifier 800 may further include a sampler 870. The sampler 870 may sample an input signal IN to generate the digital input signal DIN and provide the digital input signal DIN to the compensation unit 820. For example, when the input signal IN is an analog signal, the sampler 870 may convert the analog signal IN to the digital input signal DIN. In other examples, when the input signal IN is a digital signal, the sampler 870 may over-sample the digital signal IN to generate the digital input signal DIN.

As described above, the audio amplifier according to the example embodiments may be used in integrated circuits for amplifying an input signal rapidly and accurately. The audio amplifier according to the example embodiments may also be used in portable devices for reducing quiescent current and power consumption.

While the example embodiments and their advantages have been described in detail, it should be understood that various changes, substitutions and alterations may be made herein without departing from the scope of the inventive concept.

What is claimed is:

1. An audio amplifier comprising:
a compensation unit configured to generate a compensation signal based on a digital input signal, a digital reference code, a mode signal and a digital approximation code;
an output unit configured to generate an output signal based on the compensation signal;
a calibration unit configured to generate the digital approximation code based on the output signal and the mode signal, the digital approximation code including a plurality of bits that are generated sequentially;
wherein the calibration unit includes:
a comparator configured to compare an analog reference signal with the output signal in response to the mode signal to generate a comparison signal;
a successive approximation register configured to generate the bits of the digital approximation code sequentially from a most significant bit to a least significant bit based on the comparison signal; wherein the compensation unit includes:
a register configured to store the digital approximation code as a compensation code in response to the mode signal, the mode signal indicating a calibration mode or a normal mode, and
wherein the compensation unit generates the compensation signal based on the digital approximation code and the digital reference code in the calibration mode, and generates the compensation signal based on the compensation code and the digital input signal in the normal mode;
wherein the compensation unit further includes:
a first multiplexer configured to output one of the digital reference code and the digital input signal in response to the mode signal;
a second multiplexer configured to output one of the digital approximation code and the compensation code in response to the mode signal; and
a subtractor configured to generate the compensation signal by subtracting an output of the second multiplexer from an output of the first multiplexer.

2. The audio amplifier of claim 1, wherein the compensation unit further includes:
a digital reference code generator configured to generate the digital reference code.

3. The audio amplifier of claim 1, the calibration unit further includes:
an accumulator configured to accumulate the comparison signal to provide the accumulated comparison signal to the successive approximation register.

4. The audio amplifier of claim 1, wherein the output unit includes:
a driving unit driven by a driving voltage, and configured to amplify a modulation signal to generate an amplification signal, the modulation signal being generated based on the compensation signal; and
a low pass filter configured to filter the amplification signal to generate the output signal.

5. The audio amplifier of claim 4, wherein the driving unit includes:
a driving voltage generator configured to generate the driving voltage based on the compensation code, the driving voltage including a first driving voltage and a second driving voltage; and
a driving circuit driven by the driving voltage, and configured to amplify the modulation signal to generate the amplification signal.

6. The audio amplifier of claim 5, wherein the sum of the first driving voltage and the second driving voltage corresponds to a value calculated by subtracting the compensation code from the digital reference code.

7. The audio amplifier of claim 4, wherein the analog reference signal corresponds to a level of the driving voltage divided by N and the digital reference code corresponds to a digital level of the driving voltage divided by N, where N is a natural number.

8. The audio amplifier of claim 7, wherein the driving unit includes:
   a driving signal generator configured to generate compensation driving signals based on the compensation code and the modulation signal; and
   a driving circuit driven by the driving voltage, and configured to amplify the compensation driving signals to generate the amplification signal.

9. The audio amplifier of claim 8, wherein the driving voltage includes a first driving voltage and a second driving voltage, and
   wherein the compensation unit includes:
   a register configured to store the digital approximation code as a first compensation code when the digital reference code corresponds to a digital level of the first driving voltage divided by N, and configured to store the digital approximation code as a second compensation code when the digital reference code corresponds to a digital level of the second driving voltage divided by N; and
   a compensation code calculator configured to generate the compensation code by adding the first compensation code to the second compensation code.

10. The audio amplifier of claim 9, wherein the compensation driving signals include PMOS compensation driving signals and NMOS compensation driving signals, and
    wherein the driving circuit includes:
    a plurality of PMOS transistors connected in parallel between the first driving voltage and a first node, wherein each of the plurality of PMOS transistors has a gate electrode receiving one of the PMOS compensation driving signals; and
    a plurality of NMOS transistors connected in parallel between the second driving voltage and the first node, wherein each of the plurality of NMOS transistors has a gate electrode receiving one of the NMOS compensation driving signals.

11. The audio amplifier of claim 10, wherein when the digital reference code corresponds to the digital level of the first driving voltage divided by N, the driving signal generator generates the PMOS compensation driving signals based on the compensation code, and when the digital reference code corresponds to the digital level of the second driving voltage divided by N, the driving signal generator generates the NMOS compensation driving signals based on the compensation code.

12. The audio amplifier of claim 7, wherein the calibration unit further includes:
    an analog reference signal generator configured to generate the analog reference signal based on an analog control signal.

13. The audio amplifier of claim 12, wherein the driving voltage
    includes a first driving voltage and a second driving voltage, and the analog reference signal generator includes a plurality of resistors connected in serial between the first driving voltage and the second driving voltage.

14. The audio amplifier of claim 1, wherein the output unit includes one of a class-A amplifier, a ctass-B amplifier, a class-AB amplifier and a class-D amplifier.

15. An audio amplifier comprising:
    a sampler configured to sample an input signal to generate a digital input signal;
    a controller configured to generate a control signal, the audio amplifier determining operation mode and compensating an offset of an output signal based on the control signal;
    a compensation unit configured to generate a digital reference code based on the control signal and generate a compensation signal based on the digital reference code and a digital approximation code in a calibration mode, and configured to generate the compensation signal based on the digital input signal and the digital approximation code in a normal mode;
    a driving unit driven by a driving voltage, and configured to amplify a modulation signal to generate an amplification signal, the modulation signal being generated based on the compensation signal;
    a low pass filter configured to filter the amplification signal to generate the output signal;
    a comparator configured to compare an analog reference signal with the output signal in response to the control signal to generate a comparison signal; and
    a successive approximation register configured to generate the digital approximation code based on the comparison signal, the digital approximation code including a plurality of bits that are generated sequentially; wherein the compensation unit generates the compensation signal by subtracting the digital approximation code from the digital reference code in the calibration mode, and generates the compensation signal by subtracting the digital approximation code from the digital input signal in the normal mode.

* * * * *